(12) United States Patent  (10) Patent No.: US 9,411,222 B2
 Tricard  (45) Date of Patent: Aug. 9, 2016

(54) PHOTO-MASKS FOR LITHOGRAPHY

(71) Applicant: Zygo Corporation, Middlefield, CT (US)

(72) Inventor: Marc Tricard, Glastonbury, CT (US)

(73) Assignee: Zygo Corporation, Middlefield, CT (US)

(*) Notice: Subject to any disclaimer, the term of this patent is extended or adjusted under 35 U.S.C. 154(b) by 0 days.

(21) Appl. No.: 14/676,460

(22) Filed: Apr. 1, 2015

(65) Prior Publication Data

US 2015/0286129 A1   Oct. 8, 2015

Related U.S. Application Data

(60) Provisional application No. 61/973,979, filed on Apr. 2, 2014.

(51) Int. Cl.

| | | |
|---|---|---|
| *G03F 1/22* | (2012.01) | |
| *G03F 1/48* | (2012.01) | |
| *G03F 1/46* | (2012.01) | |
| *G03F 1/76* | (2012.01) | |
| *H05G 2/00* | (2006.01) | |
| *G21K 1/06* | (2006.01) | |

(52) U.S. Cl.
CPC .. *G03F 1/22* (2013.01); *G03F 1/46* (2013.01); *G03F 1/48* (2013.01); *G03F 1/76* (2013.01); *G21K 1/062* (2013.01); *H05G 2/001* (2013.01); *G21K 2201/067* (2013.01)

(58) Field of Classification Search
CPC .......... B82Y 10/00; B82Y 40/00; G03F 1/24; G03F 1/60; G03F 1/46; G03F 1/76; G02B 5/10
USPC .......... 250/492.22; 430/5; 359/359, 361, 838; 427/160
See application file for complete search history.

(56) References Cited

U.S. PATENT DOCUMENTS

| | | | |
|---|---|---|---|
| 4,670,205 A | 6/1987 | Montierth | |
| 6,300,018 B1 * | 10/2001 | Dilley | G03F 1/42 430/22 |
| 6,375,551 B1 | 4/2002 | Darcangelo et al. | |
| 7,064,808 B1 * | 6/2006 | Gilissen | G03F 7/70716 355/72 |
| 7,129,010 B2 * | 10/2006 | Alkemper | B82Y 10/00 428/428 |
| 8,242,039 B2 | 8/2012 | Sugawara | |
| 8,736,810 B2 * | 5/2014 | Wilklow | B82Y 10/00 355/53 |
| 8,870,396 B2 * | 10/2014 | Kaller | G02B 5/08 359/838 |
| 9,126,191 B2 * | 9/2015 | Yin | B01J 23/42 |
| 2003/0043370 A1 * | 3/2003 | Goldberg | G03F 1/84 356/237.5 |
| 2004/0009410 A1 | 1/2004 | Lercel et al. | |
| 2004/0063004 A1 * | 4/2004 | Alkemper | B82Y 10/00 430/5 |

(Continued)

FOREIGN PATENT DOCUMENTS

| | | | |
|---|---|---|---|
| KR | 10-0805360 | 2/2008 | ............ H01L 21/027 |
| WO | WO 00/75727 | 12/2000 | ................ G03F 1/14 |
| WO | WO 2010/020337 | 2/2010 | ................ G03F 1/14 |

OTHER PUBLICATIONS

International Search Report and Written Opinion of the International Searching Authority for International Application No. PCT/US2015/023899 Dated Jul. 24, 2015 (12 pages).

(Continued)

*Primary Examiner* — David A Vanore
(74) *Attorney, Agent, or Firm* — Fish & Richardson P.C.

(57) ABSTRACT

A photo-mask for use in extreme ultraviolet (EUV) lithography, in which the photo-mask has low coefficient of thermal expansion and high specific stiffness.

19 Claims, 3 Drawing Sheets

(56) References Cited

U.S. PATENT DOCUMENTS

| | | | | |
|---|---|---|---|---|
| 2007/0263200 | A1* | 11/2007 | Petrus Compen | G03F 7/707 355/72 |
| 2008/0318066 | A1* | 12/2008 | Girard | G02B 5/10 428/446 |
| 2011/0116068 | A1* | 5/2011 | Wilklow | B82Y 10/00 355/67 |
| 2013/0011547 | A1* | 1/2013 | Girard | G02B 5/10 427/8 |
| 2013/0020540 | A1* | 1/2013 | Umayahara | C03C 14/004 252/582 |
| 2013/0120863 | A1* | 5/2013 | Kaller | C03B 19/06 359/838 |
| 2015/0286129 | A1* | 10/2015 | Tricard | G21K 1/062 250/492.22 |

OTHER PUBLICATIONS

Nexcera™ Ultra Low Thermal Expansion Ceramics, *Krosaki Harima* (Jul. 2001).

Nose et al., "NEXCERA: Ultra Low Thermal Expansion Ceramics", *Nippon Steel Technical Report*, No. 84, pp. 5-11 (Jul. 2001).

Sugawara et al., ""NEXCERA", Zero Thermal Expansion Ceramics for Optical Applications", *Proceedings of ASPE 2010 Annual Meeting*, vol. 50, pp. 404-407 (2010).

The New Value Frontier Kyocera, Ceramic Components for Semiconductor Processing (8 pages) (Apr. 2014).

Kingery, *Introduction to Ceramics*, Second Edition, John Wiley & Sons, pp. 306-309 (Apr. 1976).

* cited by examiner

PHOTO-MASKS FOR LITHOGRAPHY

CROSS-REFERENCE TO

This application claims the benefit, under 35 U.S.C. §119 (e), of U.S. Provisional Application No. 61/973,979, filed on Apr. 2, 2014, and which is hereby incorporated by reference in its entirety.

TECHNICAL FIELD

The present disclosure relates to photo-masks for lithography.

BACKGROUND

In standard integrated circuit (IC) fabrication, lithography is typically used to transfer a desired pattern formed on a photo-mask to a silicon wafer, in which the photo-mask contains an enlarged view of the pattern (e.g., a magnification of the pattern by about 4 times). One example of a photo-mask format typically used in IC fabrication is known as the "6025" format (i.e., the mask is 6"×6"×0.25" in size). In a desire to continue reducing the minimum feature size, fabrication processes relying on a type of lithography known as extreme ultraviolet (EUV) lithography are being developed. Furthermore, demands for increased throughput may lead to requiring even larger mask sizes.

SUMMARY

With smaller feature sizes and larger masks, it is increasingly important to control mask qualities such as roughness, flatness and defect size/number, in order to minimize errors when transferring a pattern to a wafer. Additionally, in certain high throughput fabrication processes, photo-masks may be subjected to high accelerations (e.g., in excess of 10-20 times gravitational acceleration) during scanning. The forces resulting from the high accelerations can cause deformations in the photo-masks, leading to further degradation in the image transferred to a wafer. This disclosure relates to photo-masks that include a substrate layer that is composed of a high specific stiffness material. Photo-masks having high specific stiffness can be resistant to deformation under high acceleration, and can therefore prevent or minimize distortion of a mask pattern to be imaged.

Various aspects of the disclosure are summarized as follows. In general, in a first aspect, the subject matter of the present disclosure may be embodied in a photo-mask for use in extreme ultraviolet (EUV) lithography, in which the photo-mask includes a cordierite ceramic substrate layer.

Implementations of the photo-mask may include one or more of the following features and/or features of other aspects. For example, in some implementations, the cordierite ceramic has a Young's modulus between about 120 GPa to about 157 GPa.

In some implementations, the cordierite ceramic has a coefficient of thermal expansion between −50 parts per billion/° C. and +50 parts per billion/° C. In some implementations, the cordierite ceramic has a coefficient of thermal expansion between −20 parts per billion/° C. and +20 parts per billion/° C.

In some implementations, the photo-mask of claim 1, wherein the cordierite ceramic has a bulk density between about 2500 kg/m³ and about 2700 kg/m³.

In some implementations, the photo-mask of claim 1, wherein the cordierite ceramic has a thermal conductivity between about 3.0 W/(m·K) and about 5.0 W/(m·K).

In some implementations, the substrate layer has a thickness of about 0.25 inches or less, and the photo-mask has a surface area for a first side of the photo-mask of about 81 square inches or less.

In some implementations, the photo-mask further includes a reflector layer on a front surface of the substrate layer, a capping layer on the reflector layer, an absorber layer on the capping layer, an anti-reflection coating on the absorber layer, and a backside coating on a back surface of the substrate layer, in which the back surface is opposite the front surface.

In general, in another aspect, the subject matter of the present disclosure may be embodied in methods of fabricating a photo-mask for EUV lithography, in which the method includes obtaining a cordierite ceramic substrate layer, applying full-aperture polishing or sub-aperture polishing to the cordierite ceramic substrate layer, depositing a reflector layer on a frontside surface of the substrate layer, wherein the reflector layer comprises a plurality of alternating first and second thin films configured to form a Bragg reflector, depositing a Ru capping layer on the reflector layer, depositing a TaN absorbing layer on the capping layer, and patterning the absorbing layer to form a desired pattern.

Implementations of the methods may include one or more of the following features and/or features of other aspects.

For example, in some implementations, the method includes applying both sub-aperture polishing and full-aperture polishing to the substrate layer, in which sub-aperture polishing is applied subsequent to applying the full-aperture polishing.

In general, in another aspect, the subject matter of the present disclosure may be embodied in an illumination system that includes an EUV light source, an illumination optical system, a projection optical system, and a photo-mask having a cordierite ceramic material, in which the illumination optical system is configured to receive EUV light from the light source and redirect the EUV light onto the photo-mask, and in which the projection optical system is configured to receive EUV light reflected from the photo-mask and image the reflected EUV light onto an object located at an image plane of the projection optical system.

Implementations of the illumination system may include one or more of the following features and/or features of other aspects.

For example, in some implementations, the cordierite ceramic has a Young's modulus between about 120 GPa to about 157 GPa.

In some implementations, the cordierite ceramic has a coefficient of thermal expansion between −50 parts per billion/° C. and +50 parts per billion/° C. In some implementations, the cordierite ceramic has a coefficient of thermal expansion between −20 parts per billion/° C. and +20 parts per billion/° C.

In some implementations, the cordierite ceramic has a bulk density between about 2500 kg/m³ and about 2700 kg/m³.

In some implementations, the cordierite ceramic has a thermal conductivity between about 3.0 W/(m·K) and about 5.0 W/(m·K).

In some implementations, the substrate layer has a thickness of about 0.25 inches or less, and the photo-mask has a surface area for a first side of the photo-mask of about 81 square inches or less.

In general, in another aspect, the subject matter of the present disclosure may be embodied in an a photo-mask for use in extreme ultraviolet (EUV) lithography, in which the photo-mask includes a substrate layer comprising a Young's modulus between about 120 GPa to about 157 GPa and a coefficient of thermal expansion between −50 parts per billion/° C. and +50 parts per billion/° C., e.g., between −20 parts per billion/° C. and +20 parts per billion/° C.

In general, in another aspect, the subject matter of the present disclosure may be embodied in a device that includes an EUV lithography photo-mask, the photo-mask including an oxide ceramic $Mg_aLi_bFe_cAl_dSi_eO_f$ substrate layer, in which a, b, c, d, e, and f are in the range of 1.8 to 1.9, 0.1 to 0.3, 0 to 0.2, 3.9 to 4.1, 6.0 to 7.0, and 19 to 23, respectively, and in which the substrate layer has a Young's modulus between about 120 GPa to about 157 GPa and a coefficient of thermal expansion between −50 parts per billion/° C. and +50 parts per billion/° C.

In general, in another aspect, the subject matter of the present disclosure may be embodied in a device that includes an EUV lithography photo-mask, the photo-mask including a substrate layer, in which the substrate layer includes cordierite as a primary component, and one or more selected from the group consisting of La, Ce, Sm, Gd, Dy, Er, Yb and Y in an oxide equivalent amount of 1 to 8 mass %, in which a mass ratio between the primary components has the following ratios: $3.85 \leq SiO_2/MgO \leq 4.60$, and $2.50 \leq Al_2O_3/MgO \leq 2.70$, and in which the substrate layer has a Young's modulus between about 120 GPa to about 157 GPa and a coefficient of thermal expansion between −50 parts per billion/° C. and +50 parts per billion/° C.

Certain implementations may have particular advantages. For example, a photo-mask having a substrate layer composed of a high-specific stiffness material may be resistant to deformation under high acceleration, and can therefore prevent or minimize distortion of a mask pattern to be imaged. In some instances, a high specific stiffness material for the substrate layer allows fabrication of a photo-mask that has less total mass for a particular overall mask stiffness and/or higher accelerations can be accommodated with such a high specific stiffness mask for a given amount of mask distortion. In some cases, the use of cordierite as the substrate layer material provides an increase in thermal conductivity of the mask, so that more heat can be removed from the mask during use.

The details of one or more embodiments are set forth in the accompanying drawings and the description below. Other features and advantages will be apparent from the description, the drawings, and the claims.

DETAILED DESCRIPTION

Figure 1:
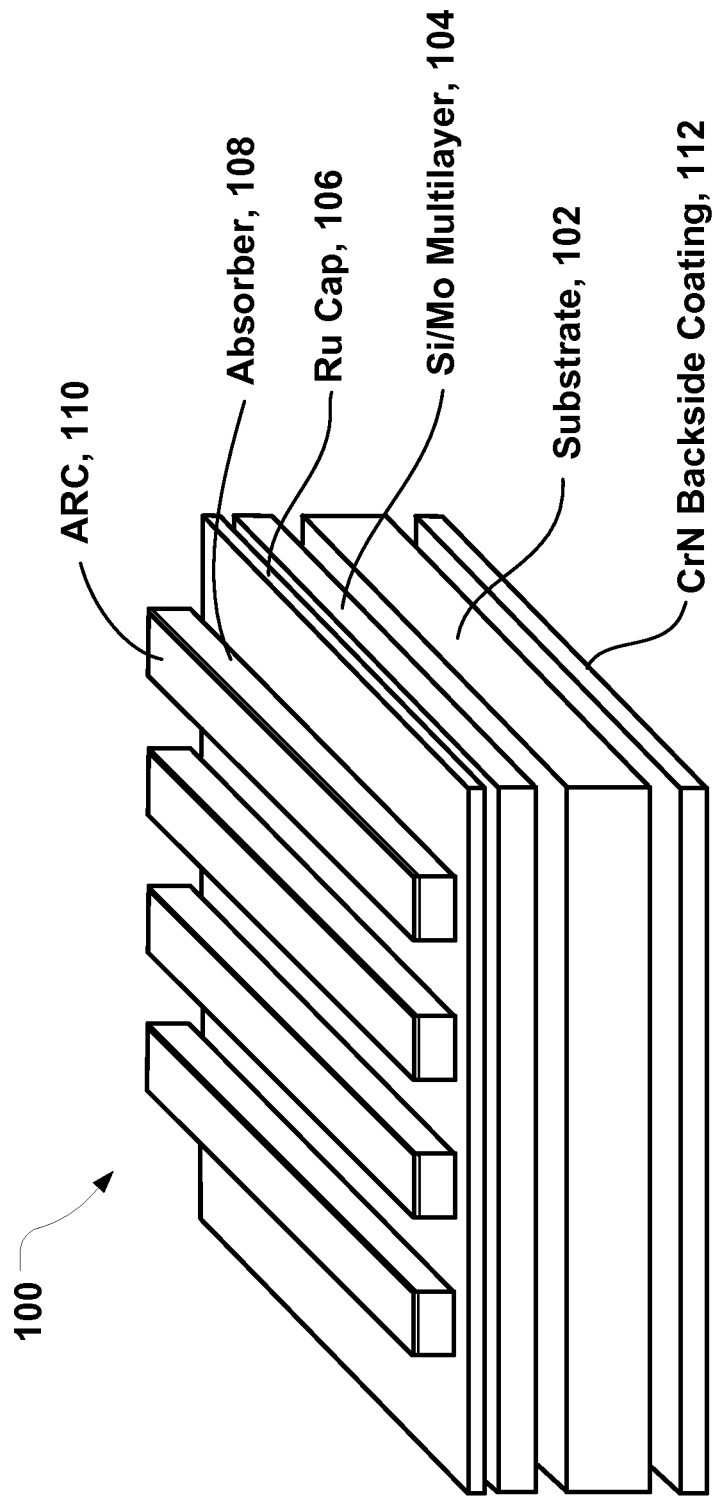
FIG. 1 is a schematic illustrating an example of a reflective photo-mask for use in EUV lithography applications.

FIG. 1 is a schematic illustrating an example of a reflective photo-mask 100 for use in EUV lithography applications. The photo-mask is constructed of several layers including a substrate layer 102, a reflector layer 104 that contains alternating thin films of Molybdenum and Silicon (e.g., 40 or more Mo/Si thin-film layer pairs), a capping layer 106, an absorber layer 108, and an anti-reflection coating (ARC) layer 110. The mask 100 may also include a backside coating 112 (e.g., composed of chrome nitride (CrN)) that allows for electrostatic chucking.

Since nearly all matter absorbs EUV, the substrate layer 102 should be formed of a material having a relatively low coefficient of thermal expansion (CTE) to prevent the mask 100 from warping or otherwise distorting the pattern formed on the mask. The alternating thin films of the reflector layer 104 form a Bragg reflector that is configured to maximize reflection at the wavelength of the incident radiation (e.g., at about 13.5 nm for current EUV and/or 6.7 nm being contemplated for future tools). The capping layer 106 is formed from a material such as ruthenium (Ru) to prevent oxidation of the underlying reflector layer 104. The absorber layer 108 may be composed of, for example, tantalum boron nitride (TaBN), and covered with an anti-reflective oxide as the ARC coating layer 110. The absorber layer 108 is constructed to have the desired pattern that will be transferred from the mask 100 to the wafer. For instance, the example shown in FIG. 1 includes an absorber layer 108 arranged as a series of parallel lines.

In order to inhibit deformation that the mask may experience as a result of high accelerations during scanning operations, the substrate layer material includes a low CTE material that has a relatively high specific stiffness. Specific stiffness can be expressed as the elastic modulus per mass density of a material, such that a material with high specific stiffness has either high Young Modulus or low density, or both high Young Modulus and low density. With a higher specific stiffness, the substrate layer 102, and therefore the mask as a whole, is resistant to deformation under high acceleration, and can prevent distortion of the mask pattern to be imaged. Alternatively, the higher specific stiffness allows the mask as a whole to undergo higher accelerations and speeds, while maintaining the same level of distortion that a mask having a substrate layer composed of lower Specific Stiffness would experience at lower accelerations and speeds. By translating the masks at higher speeds without an increase in distortion, the throughput (e.g., number of silicon wafers processed per unit time) can be increased.

A class of materials that provides high specific stiffness is the cordierite class of ceramics. Cordierite ceramics typically includes a mixture of magnesium oxide (e.g., MgO), aluminum oxide (e.g., $Al_2O_3$) and silicon dioxide ($SiO_2$). For instance, a type of cordierite ceramic fabricated by various chemical manufacturers has a relative ratio of primary components as follows: $2MgO-2Al_2O_3-5SiO_2$. This material is also called "Cordierite" or α-cordierite. Table 1 below provides a representative example of the key properties of different cordierite materials (CO211, CO711, CO712, and CO720) fabricated by the manufacturer Kyocera and provides a comparison to Zerodur® available from Schott®:

TABLE 1

| Property | Units | CO211 | CO711 | CO712 | CO720 | Zerodur ® |
| --- | --- | --- | --- | --- | --- | --- |
| Bulk Density | $kg/m^3 \cdot 10^3$ | 2.67 | 2.68 | 2.7 | 2.55 | 2.53 |
| Water Absorption | % | 0 | 0 | 0 | 0 | 0 |
| Vickers Hardness | GPa | 7.2 | 7.7 | 7.7 | 7.7 | 6.2 |
| Flexural Strength | MPa | 150 | 236 | 252 | 225 | 80 |
| Young's Modulus | GPa | 140 | 143 | 144 | 144 | 90 |
| Poisson's Ratio | | 0.31 | 0.31 | 0.31 | 0.31 | — | 0.24 |
| CTE (@22° C.) | ppb/° C. | 0 ± 100 | 0 ± 50 | 0 ± 20 | 0 ± 20 | 0 ± 20 |

TABLE 1-continued

| Property | Units | CO211 | CO711 | CO712 | CO720 | Zerodur® |
|---|---|---|---|---|---|---|
| Thermal Conductivity | W/(m·K) | 4.0 | 4.0 | 4.0 | 4.3 | 1.5 |
| Volume Resistivity | Ω·cm | >$10^{14}$ | >$10^{14}$ | >$10^{14}$ | >$10^{14}$ | — |

As can be seen from TABLE 1, the cordierite materials have a Young's modulus that substantially exceeds the Young's modulus of Zerodur® (i.e., about a 55% increase) and a density that is only slightly higher than the density of Zerodur®. Moreover, the cordierite materials have a CTE that is comparable to the CTE of Zerodur®, indicating that cordierite is a suitable candidate as a mask substrate layer for use in EUV lithography applications, since it will not substantially expand when absorbing the EUV rays. In addition, cordierite's thermal conductivity is almost three times higher than that of Zerodur®, allowing the material to remove heat to a greater extent during use.

While the high Young's Modulus of cordierite is useful for minimizing distortion of the mask during high speed scanning, the increased stiffness may alternatively allow a reduction in the photo-mask size. That is, to obtain a substrate layer having a particular overall stiffness, less mass may be required using cordierite than using materials having lower Young's Modulus, such as Zerodur®, ultra low expansion (ULE) glass-ceramics, and ClearCeram®. Accordingly, using cordierite as the substrate layer material allows the size (e.g., thickness) of the substrate layer to be reduced while maintaining the same overall mask stiffness obtained with substrates having lower Young's Modulus. For instance, the thickness of the substrate composed of cordierite could be reduced by 10%, 15%, 20%, 25%, 30%, 35%, 40%, 45%, 50%, or 55% relative to substrates composed of materials having a lower Young's Modulus, while retaining the same overall stiffness.

Different cordierite ceramics may have different values from those listed in TABLE 1. For instance, the range of bulk density for a cordierite ceramic may be between about 2500 kg/m$^3$ and about 2700 kg/m$^3$, including about 2500 kg/m$^3$, about 2600 kg/m$^3$, or about 2650 kg/m$^3$. The range of Vickers hardness for a cordierite ceramic may be between about 7 GPa to about 8.5 GPa, including about 7 GPa, about 7.5 GPa, about 8.0 GPa, about 8.1 GPa, or about 8.5 GPa. The range of flexural strength for a cordierite ceramic may be between about 100 MPa to about 300 MPa, including about 116 MPa, about 185 MPa, about 210 MPa, about 230 MPa, about 250 MPa, about 290 MPa, or about 300 MPa. The Young's modulus for a cordierite ceramic may be between about 120 GPa to about 157 GPa, including about 120 GPa, about 125 GPa, about 130 GPa, about 135 GPa, about 145 GPa, about 150 GPa, about 155 GPa, or about 157 GPa. The CTE for a cordierite ceramic material may be within 0±100 ppb/° C., including within 0±5 ppb/° C., within 0±10 ppb/° C., within 0±20 ppb/° C., within ±0 30 ppb/° C., within 0±40 ppb/° C., within 0±50 ppb/° C., within 0±60 ppb/° C., within 0±70 ppb/° C., within 0±80 ppb/° C., or within 0±90 ppb/° C. The thermal conductivity of a cordierite ceramic may be between about 3.0 W/(m·K) and about 5.0 W/(m·K), including about 3.5 W/(m·K), about 3.6 W/(m·K), about 3.7 W/(m·K), about 3.8 W/(m·K), about 3.9 W/(m·K), about 4.1 W/(m·K), about 4.2 W/(m·K), about 4.4 W/(m·K), about 4.5 W/(m·K), about 4.6 W/(m·K), about 4.7 W/(m·K), about 4.8 W/(m·K), about 4.9 W/(m·K), or about 5.0 W/(m·K). The volume resistivity of a cordierite ceramic may be between about $10^{10}$ Ω·m and about $10^{15}$ Ω·m.

Unlike mask materials such as ULE and others used in traditional photolithography, cordierite is not transparent, and therefore not an immediately apparent substrate material. However, since EUV masks can be constructed so that the pattern to be image on the wafer is formed based on a combination of absorption and reflection of EUV light from the mask, not transmission through the mask, cordierite can be used as an acceptable substrate material despite its opacity.

As explained above, it is important to control mask qualities such as roughness, flatness and defect size/number in EUV lithography, in order to minimize errors when transferring a pattern to a wafer. TABLE 2 below provides an example of stringent guidelines for mask flatness, roughness and defect density generally followed by industry. Examples of guidelines can be found in Semiconductor Equipment and Materials International (SEMI) P37-0613 entitled "Specification for Extreme Ultraviolet substrates and blanks" and SEMI P40-1109 entitled "Specification for mounting requirements for Extreme Ultraviolet lithography mask."

TABLE 2

| Property | Requirements |
|---|---|
| Frontside (FS) Flatness (PV) | ≤30 nm |
| Backside (BS) Flatness (PV) | ≤30 nm |
| FS Roughness (λ ≤ 10 µm) rms | ≤0.1 nm |
| FS Local slope (400 nm ≤ λ ≤ 100 mm) | <1 mrad |
| BS Roughness (50 nm ≤ λ ≤ 10 µm) | ≤0.50 nm |
| Defect Density @ 50 nm (SiO$_2$ Eq.) | ≤0.008 |

However, synthetic cordierite ceramic materials are, in general, polycrystalline and the corresponding local anisotropy poses a significant challenge when trying to achieve the strict requirements for roughness and flatness necessary for using EUV masks in large throughput industrial applications. For instance, the removal rate of a chemical mechanical polishing process or other polishing process may vary between the different plane orientations of the polycrystalline material limiting the minimum roughness that can be achieved.

To obtain super-low roughness including less than 0.3 nm roughness (e.g., 0.2 nm or less rms roughness, or 0.1 nm or less rms roughness), the cordierite substrate layer is polished using full-aperture polishing and/or sub-aperture polishing. Full-aperture polishing processes (sometimes referred to as "continuous polishers") typically refer to polishing processes where the polishing pad of a polishing machine is bigger than the surface of the substrate being polished, resulting in an effective polishing area substantially equivalent to the area of the substrate. Full-aperture polishing methods often require multiple, long, iterative cycles involving polishing, metrology and process changes (e.g., adjusting type and particle size distribution of abrasives, adjusting type of polishing pads, adjusting polishing speed, and/or adjusting polishing pressure) to achieve the desired surface figure. For instance, to achieve very low roughness, a very fine grain cerium oxide and/or colloidal silica abrasive could be used while adjusting pH of the polish (e.g., between 2-12, such as between 4 to 6), polishing pad pressure (e.g., less than 2 pounds per square inch (PSI), such as between 1 to 1.5 PSI), and/or polishing pad velocity (e.g., a polishing pad wheel speed of about 50 RPM). Sub-aperture polishing processes typically refer to polishing processes where the polishing zone (sometimes referred to as "spot") is substantially smaller than the surface of the substrate being polished. Examples of sub-aperture polishing processes include computer controlled polishing (CCP), computer controlled optical surfacing (CCOS), ion beam finishing (IBF) and magneto-rheological finishing (MRF). This polishing process is capable of obtaining roughness values below at or below about 0.430 nm rms (e.g., at or below about 0.421 nm rms, at or below about 0.415 nm rms, at or below about 0.400 nm rms, at or below about 0.350 nm rms, at or below about 0.300 nm rms, at or below about 0.250 nm rms, at or below about 0.200 nm rms, at or below about 0.150 nm rms, at or below about 0.100 nm rms, and at or below about 0.050 nm rms).

Full-aperture and/or sub-aperture processing also can be used to achieve the desired level of flatness (e.g., less than or equal to 30 nm PV for front side (FS) and back side (BS)) The level of flatness of the cordierite material that can be obtained using either full or sub-aperture polishing is, e.g., at or below about 100 nm, at or below about 50 nm, at or below about 30 nm, at or below about 25 nm, at or below about 20 nm, at or below about 15 nm, at or below about 10 nm, at or below about 5 nm, at or below about 2 nm, and at or below 1 nm.

Figure 2:
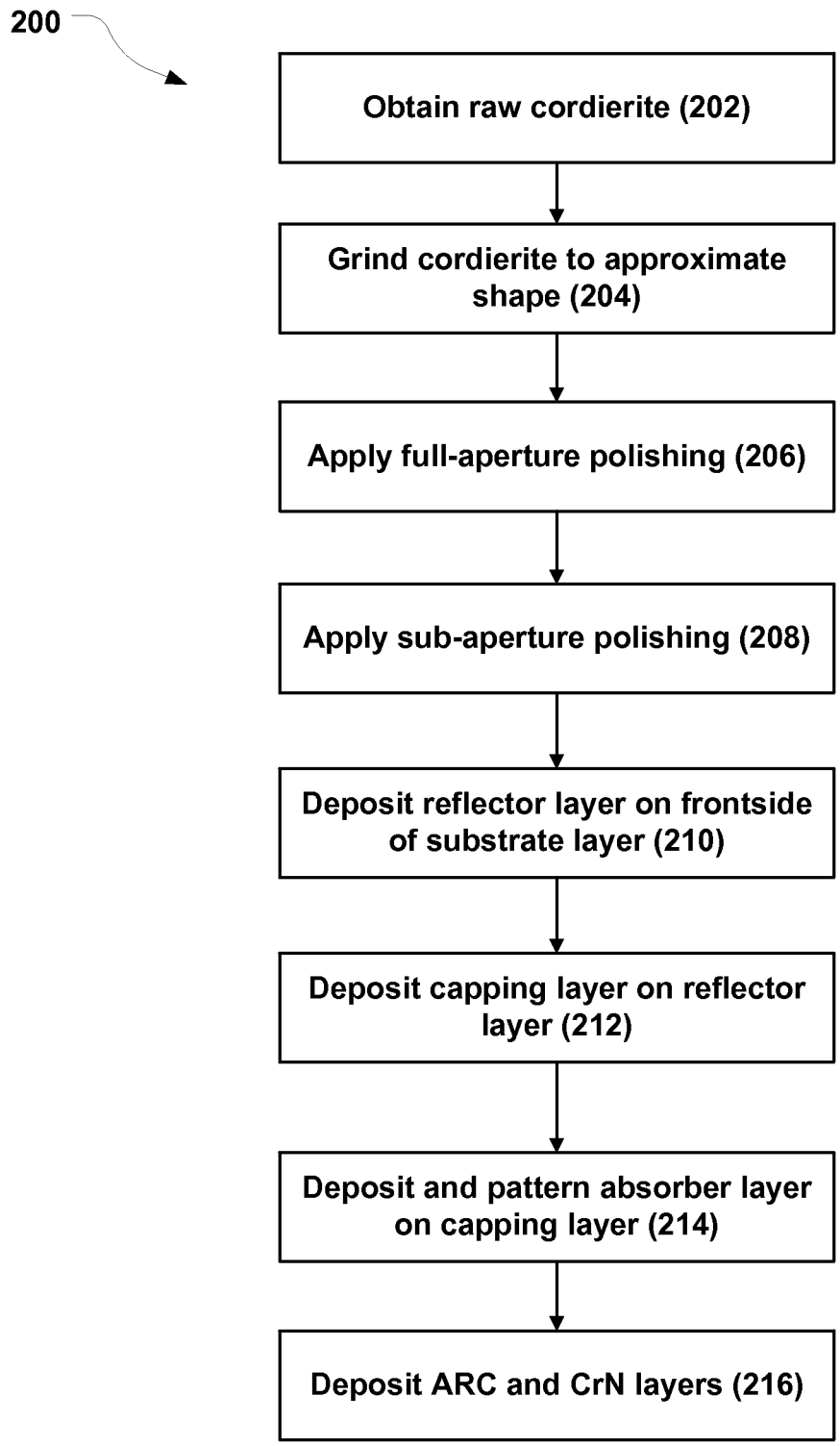
FIG. 2 is a flow-chart showing an example of a fabrication process for manufacturing a photo-mask.

An example of a manufacturing process 200 for an EUV mask having cordierite material as a substrate layer is shown in FIG. 2 and includes: obtaining (202) raw cordierite material; grinding (204) the cordierite material to the approximate dimensions of the photo-mask; applying full-aperture polishing (206) to the cordierite; optionally applying sub-aperture finishing (208) (e.g., using techniques such as CCP, CCOS, IBF or MRF); depositing a reflector layer (210) on a frontside surface of the substrate layer (e.g., using ion-beam sputtering of alternating thin-films of Si and Mo); depositing a capping layer on the reflector layer (212) (e.g., using ion-beam sputtering of Ru); depositing and patterning an absorber layer (214) (e.g., using ion-beam sputtering of TaN). The absorber layer may be patterned using e-beam writing, chemical etching or lift-off techniques. In some cases, an ARC film is formed on the surface of the absorber layer, and a CrN film is formed on a backside surface of the substrate layer (216). Those films also may be deposited using ion-beam sputtering. Surface metrology may be performed on the cordierite substrate layer between any of the foregoing steps and intermittently during each step to evaluate the surface quality (e.g., flatness, roughness, and defects) of the mask. For additional details on full and sub-aperture polishing see, e.g., EP 2089186, incorporated herein by reference in its entirety.

In some implementations, the substrate layer may be fabricated to have a pre-defined shape, such as slightly concave or slightly convex. By forming the substrate layer with a pre-defined shape, it may compensate for deformation and distortions in the substrate layer caused by stress from thin-film coatings, gravity and/or mounting the substrate layer (e.g. mounting the substrate layer using electrostatic chucking) That is, any bowing or bending caused by film stress, gravity and/or mounting may be balanced out by the pre-defined concave or convex shape of the substrate layer so that, during use, the photo-mask is substantially flat. The size of the mask formed using the substrate may vary as well. For example, in some implementations, the front side of the mask may have an area that is about 81 square inches or less, about 64 square inches or less, about 49 square inches or less, about 36 square inches or less, or about 25 square inches or less. The substrate layer may have a thickness of about 0.25 inches or less, such as about 0.20 inches or less, about 0.15 inches or less, or 0.10 inches or less.

In some implementations, the chuck on which the photo-mask is secured also may be substantially composed of a cordierite material. An advantage of forming the chuck from the same material as the substrate layer is that the chuck and photo-mask will have closely matching CTEs, thus minimizing the occurrence of forces that cause the photo-mask to deform (i.e., forces that would otherwise occur due to differential expansion between the photo-mask and the chuck under absorption of EUV).

In some implementations, a cordierite-based sintered body which includes cordierite as a primary component, and one or more selected from the group consisting of La, Ce, Sm, Gd, Dy, Er, Yb and Y in an oxide equivalent amount of 1 to 8 mass %, in which a mass ratio between the primary components has the following ratios: $3.85 \leq SiO_2/MgO \leq 4.60$, and $2.50 \leq Al_2O_3/MgO \leq 2.70$, can be used for the EUV mask, e.g., as the mask substrate material. Such materials can have thermal expansions of within ±0.02 ppm/K and a Young's modulus of between about 120 GPa to about 157 GPa, EUV masks formed from a cordierite-based sintered body which includes cordierite as a primary component, and one or more selected from the group consisting of La, Ce, Sm, Gd, Dy, Er, Yb and Y in an oxide equivalent amount of 1 to 8 mass %, can be fabricated and polished using the same procedures as set forth herein with respect to cordierite.

In some implementations, material other than cordierite that has high specific stiffness, low CTE material, and the same or similar crystal structure as cordierite also can be used for an EUV mask, e.g., as the mask substrate material. For instance, oxide ceramic materials composed of regularly mixed solid solution crystals of the elements lithium, magnesium, aluminum, iron, silicon, and oxygen can be used as the mask substrate material. The solid solution can be substantially represented by the chemical formula $Mg_aLi_bFe_cAl_dSi_eO_f$ (where a, b, c, d, e, and f range from 1.8 to 1.9, 0.1 to 0.3, 0 to 0.2, 3.9 to 4.1, 6.0 to 7.0, and 19 to 23, respectively). An example of this material is called NEXCERA® (e.g., NEXCERA N113G) available from Nippon Steel Inc. The $Mg_aLi_bFe_cAl_dSi_eO_f$ oxide ceramics can have thermal expansions of within ±0.02 ppm/K, a Young's modulus of at least about 120 GPa, and a specific rigidity of at least about 50 $GPa/g/cm^3$. EUV masks formed from the $Mg_aLi_bFe_cAl_dSi_eO_f$ oxide ceramic can be fabricated and polished using the same procedures as set forth herein with respect to cordierite.

Lithography Tool Applications

Lithography tools are especially useful in lithography applications used in fabricating large scale integrated circuits such as computer chips and the like. Lithography is the key technology driver for the semiconductor manufacturing industry. The function of a lithography tool is to direct spatially patterned radiation onto a photoresist-coated wafer. The process involves determining which location of the wafer is to receive the radiation (alignment) and applying the radiation to the photoresist at that location (exposure).

During exposure, a radiation source illuminates a patterned photo-mask, which scatters the radiation to produce the spatially patterned radiation. In the case of reduction lithography, a reduction lens collects the scattered radiation and forms a reduced image of the mask pattern. The radiation initiates photo-chemical processes in the resist that convert the radiation pattern into a latent image within the resist. To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer. In certain lithography tools, e.g., lithography scanners, the mask is also positioned on a translatable stage that is moved in concert with the wafer during exposure.

In general, the lithography tool, also referred to as an exposure system, typically includes an illumination system and a wafer positioning system. The illumination system includes a radiation source for providing radiation such as extreme ultraviolet, ultraviolet, visible, x-ray, electron, or ion radiation, and a photo-mask for imparting the pattern to the radiation, thereby generating the spatially patterned radiation. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps.

Figure 3:
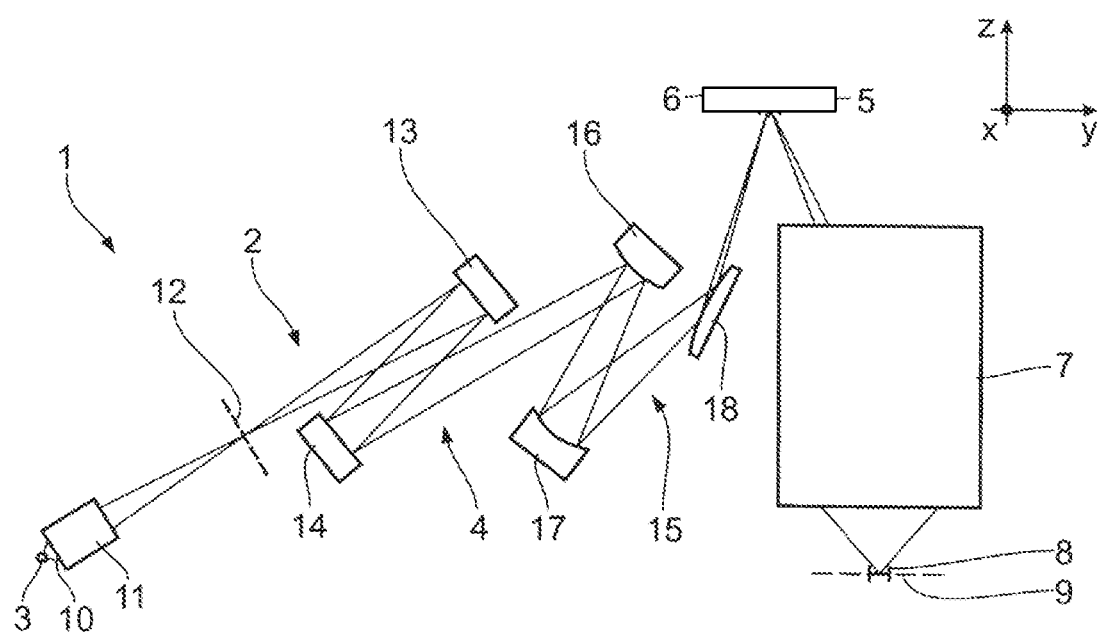
FIG. 3 is a schematic that illustrates an example of a projection exposure system.

FIG. 3 is a schematic that illustrates, in a meridional section, an example of a projection exposure system 1 for microlithography. An illumination system 2 of the projection exposure system 1, apart from a radiation source 3, has an illumination optical system 4 to expose a reflective mask 5 in an object plane 6. The reflective mask 5 carries a pattern to be projected with the projection exposure system 1 to produce microstructured or nanostructured semiconductor components. A projection optical system 7 is used to image the pattern from the mask 5 in an image field 8 in an image plane 9. The pattern on the mask is imaged on a light-sensitive layer of a wafer, which is arranged in the region of the image field 8 in the image plane 9 and is not shown in the drawing. The mask 5 may include an EUV mask, such as the EUV mask including a cordierite substrate layer, as described herein.

The mask, which is held by a mask holder, not shown, and the wafer, which is held by a wafer holder, not shown, are synchronously scanned in the y-direction during operation of the projection exposure system 1. Depending on the imaging scale of the projection optical system 7, a scanning of the mask in the opposite direction relative to the wafer can also take place.

The radiation source 3 is an EUV radiation source with an emitted useful radiation in the range between 5 nm and 30 nm. This may be a plasma source, for example a DPP source (Discharged Produced Plasma) or an LDP source (Laser Assisted Discharge Plasma). Other EUV radiation sources, for example those which are based on a synchrotron or on a free electron laser (FEL), are possible.

EUV radiation 10, which is emitted from the radiation source 3, is bundled by a collector 11. A corresponding collector is known, for example, from EP 1 225 481 A. After the collector 11, the EUV radiation 10 propagates through an intermediate focus plane 12, before it impinges on a field facet mirror 13. The field facet mirror 13 is arranged in a plane of the illumination optical system 4, which is optically conjugated with the object plane 6. After the field facet mirror 13, the EUV radiation 10 is reflected by a pupil facet mirror 14. The pupil facet mirror 14 is arranged in a plane of the illumination optical system 4, which is a pupil plane of the projection optical system 7 or is optically conjugated to a pupil plane of the projection optical system 7. With the aid of the pupil facet mirror 14 and an imaging optical module in the form of a transmission optical system 15 with mirrors 16, 17 and 18 designated in the order of the beam path for the EUV radiation 10, the field facets of the field facet mirror 13 are imaged overlapping one another in the object field where mask 5 is located. The last mirror 18 of the transmission optical system 15 is a grazing incidence mirror. The illumination light 10 is guided from the radiation source 3 to the mask 5 by way of a plurality of illumination channels. Associated with each of these illumination channels is a field facet of the field facet mirror 13 and a pupil facet of the pupil facet mirror 14 arranged downstream thereof. The individual mirrors of the field facet mirror 13 and of the pupil facet mirror 14 may be tilted by actuator, so a change of the association of the pupil facets with the field facets and, accordingly, a changed configuration of the illumination channels can be achieved. Different illumination settings result, which differ with respect to the distribution of the illumination angles of the illumination light 10 over the mask 5.

A number of embodiments have been described. Nevertheless, it will be understood that various modifications may be made without departing from the spirit and scope of the invention. Other embodiments are within the scope of the following claims.

What is claimed is:

1. A photo-mask for use in extreme ultraviolet (EUV) lithography, the photo-mask comprising:
   a cordierite ceramic substrate layer;
   a reflector layer on a front surface of the substrate layer;
   a capping layer on the reflector layer;
   an absorber layer on the capping layer;
   an anti-reflection coating on the absorber layer; and
   a backside coating on a back surface of the substrate layer, wherein the back surface is opposite the front surface.

2. The photo-mask of claim 1, wherein the cordierite ceramic has a Young's modulus between about 120 GPa to about 157 GPa.

3. The photo-mask of claim 1, wherein the cordierite ceramic has a coefficient of thermal expansion between −50 parts per billion/° C. and +50 parts per billion/° C.

4. The photo-mask of claim 2, wherein the cordierite ceramic has a coefficient of thermal expansion between −20 parts per billion/° C. and +20 parts per billion/° C.

5. The photo-mask of claim 1, wherein the cordierite ceramic has a bulk density between about 2500 kg/m$^3$ and about 2700 kg/m$^3$.

6. The photo-mask of claim 1, wherein the cordierite ceramic has a thermal conductivity between about 3.0 W/(m·K) and about 5.0 W/(m·K).

7. The photo-mask of claim 1, wherein the substrate layer has a thickness of about 0.25 inches or less, and the photo-mask has a surface area for a first side of the photo-mask of about 81 square inches or less.

8. A method of fabricating a photo-mask for EUV lithography, the method comprising:
   obtaining a cordierite ceramic substrate layer;
   applying full-aperture polishing or sub-aperture polishing to the cordierite ceramic substrate layer;
   depositing a reflector layer on a frontside surface of the substrate layer, wherein the reflector layer comprises a plurality of alternating first and second thin films configured to form a Bragg reflector;
   depositing a Ru capping layer on the reflector layer;
   depositing a TaN absorbing layer on the capping layer; and
   patterning the absorbing layer to form a desired pattern.

9. The method of claim 8, comprising applying both sub-aperture polishing and full-aperture polishing to the substrate layer, wherein sub-aperture polishing is applied subsequent to applying the full-aperture polishing.

10. An illumination system comprising:
    an EUV light source;
    an illumination optical system;
    a projection optical system; and a photo-mask comprising a cordierite ceramic material, a reflector layer on a front surface of the substrate layer, a capping layer on the reflector layer, an absorber layer on the capping layer, an anti-reflection coating on the absorber layer, and a backside coating on a back surface of the substrate layer, wherein the back surface is opposite the front surface, wherein the illumination optical system is configured to receive EUV light from the light source and redirect the EUV light onto the photo-mask, and wherein the projection optical system is configured to receive EUV light reflected from the photo-mask and image the reflected EUV light onto an object located at an image plane of the projection optical system.

11. The illumination system of claim 10, wherein the cordierite ceramic has a Young's modulus between about 120 GPa to about 157 GPa.

12. The illumination system of claim 10, wherein the cordierite ceramic has a coefficient of thermal expansion between −50 parts per billion/° C. and +50 parts per billion/° C.

13. The illumination system of claim 12, wherein the cordierite ceramic has a coefficient of thermal expansion between −20 parts per billion/° C. and +20 parts per billion/° C.

14. The illumination system of claim 10, wherein the cordierite ceramic has a bulk density between about 2500 kg/m$^3$ and about 2700 kg/m$^3$.

15. The illumination system of claim 10, wherein the cordierite ceramic has a thermal conductivity between about 3.0 W/(m·K) and about 5.0 W/(m·K).

16. The illumination system of claim 10, wherein the substrate layer has a thickness of about 0.25 inches or less, and the photo-mask has a surface area for a first side of the photo-mask of about 81 square inches or less.

17. A photo-mask for use in extreme ultraviolet (EUV) lithography, the photo-mask comprising:

a substrate layer comprising a Young's modulus between about 120 GPa to about 157 GPa and a coefficient of thermal expansion between −50 parts per billion/° C. and +50 parts per billion/° C., a reflector layer on a front surface of the substrate layer, a capping layer on the reflector layer, an absorber layer on the capping layer, an anti-reflection coating on the absorber layer, and a backside coating on a back surface of the substrate layer, wherein the back surface is opposite the front surface.

18. A device comprising:

an extreme ultraviolet (EUV) lithography photo-mask, the photo-mask comprising an oxide ceramic $Mg_aLi_bFe_cAl_dSi_eO_f$ substrate layer, wherein a, b, c, d, e, and f are in the range of 1.8 to 1.9, 0.1 to 0.3, 0 to 0.2, 3.9 to 4.1, 6.0 to 7.0, and 19 to 23, respectively, and wherein the substrate layer comprises a Young's modulus between about 120 GPa to about 157 GPa and a coefficient of thermal expansion between −50 parts per billion/° C. and +50 parts per billion/° C.

19. A device comprising:

an extreme ultraviolet (EUV) lithography photo-mask, the photo-mask comprising a substrate layer, wherein the substrate layer comprises cordierite as a primary component, and one or more selected from the group consisting of La, Ce, Sm, Gd, Dy, Er, Yb and Y in an oxide equivalent amount of 1 to 8 mass %, wherein a mass ratio between the primary components has the following ratios: $3.85 \leq SiO_2/MgO \leq 4.60$, and $2.50 \leq Al_2O_3/MgO \leq 2.70$, and wherein the substrate layer comprises a Young's modulus between about 120 GPa to about 157 GPa and a coefficient of thermal expansion between −50 parts per billion/° C. and +50 parts per billion/° C.

* * * * *